United States Patent
Takahashi et al.

(10) Patent No.: US 6,998,893 B2
(45) Date of Patent: Feb. 14, 2006

(54) CIRCUIT AND METHOD FOR INDUCING JITTER TO A SIGNAL

(75) Inventors: Hisao Takahashi, Kanagawa (JP); Fujihiko Omiya, Tokyo (JP); Hideaki Okuda, Kanagawa (JP); Ryoichi Sakai, Shizuoka (JP); Toru Takai, Tokyo (JP)

(73) Assignee: Tektronix International Sales GmbH, Schaffhausen (CH)

( * ) Notice: Subject to any disclaimer, the term of this patent is extended or adjusted under 35 U.S.C. 154(b) by 0 days.

(21) Appl. No.: 10/726,079

(22) Filed: Dec. 1, 2003

(65) Prior Publication Data

US 2004/0135606 A1   Jul. 15, 2004

(30) Foreign Application Priority Data

Dec. 2, 2002 (JP) .............................. 2002-350436
Mar. 19, 2003 (JP) .............................. 2003-076026

(51) Int. Cl.
 *H03K 5/12* (2006.01)
(52) U.S. Cl. ...................................... 327/170; 327/263
(58) Field of Classification Search ............... 327/141, 327/144, 146–149, 152–153, 155–158, 161, 327/233–236, 237, 243–245, 292–293, 170, 327/263
See application file for complete search history.

(56) References Cited

U.S. PATENT DOCUMENTS

| | | | | |
|---|---|---|---|---|
| 5,298,866 A | * | 3/1994 | Kaplinsky | 327/261 |
| 5,327,411 A | * | 7/1994 | Iwasa et al. | 369/59.12 |
| 5,880,612 A | * | 3/1999 | Kim | 327/158 |
| 6,127,871 A | | 10/2000 | Moll | 327/270 |
| 6,775,342 B1 | * | 8/2004 | Young et al. | 375/371 |
| 2003/0041294 A1 | | 2/2003 | Lazar | 714/709 |

FOREIGN PATENT DOCUMENTS

JP        6-273489 A        9/1994

* cited by examiner

Primary Examiner—Linh My Nguyen
(74) Attorney, Agent, or Firm—William K. Bucher

(57) ABSTRACT

A jitter inducing circuit receives a reference pulse train and induces desired amounts of jitter to the rising and/or falling edges of the pulses. First and second delay blocks 16 and 18 alternately delay the selected edge or edges of the provided reference pulse train interval by preset delay times for every interval. A signal composer 46 composes the outputs of the first and second delay blocks 16 and 18. A delay time setup circuit controls the delay times of the delay blocks 16 and 18. The delay times may change for each interval as a function of time so as to trace a desired function such as a sinusoidal or triangular function.

8 Claims, 13 Drawing Sheets

CIRCUIT AND METHOD FOR INDUCING JITTER TO A SIGNAL

BACKGROUND OF THE INVENTION

The present invention relates generally to jitter generators and more particularly to circuits and methods for intentionally inducing desired amounts of jitter to the edges of pulses of a pulse train for use for testing a device under test.

Digital signals provided to digital circuitry are not always in an ideal condition with noise in the digital signal producing jitter. Therefore, digital circuits are required to be able to operate in the presence of jitter in the digital signal, or pulse train. It is also important to test digital circuits during development using digital test signals or pulse trains that include jitter. This test is called jitter tolerance test.

A jitter test signal may be generated by inducing jitter to a stable digital test signal, called a reference pulse train hereafter. The reference pulse train and the jitter pulse train are provided to a digital circuit and would allow for a comparison test between the stable reference pulse train and the jitter pulse train. To induce jitter to the edges of the pulses in the reference pulse train, the edges are delayed and the delay time is varied.

FIG. 1 shows a block diagram disclosed in Japanese patent publication No. 7-95022 (non-examined) of a prior art circuit for delaying the rising edge and/or the falling edge of a pulse provided to the circuit. A buffer 1 receives an input pulse train and provides non-inverted and inverted outputs to delay circuits 2 and 3 respectively. First and second delay setup signals are provided to the delay circuits 2 and 3 to independently set delay times td1 and td2 respectively. An AND gate 4 receives the output of the delay circuit 2 and the non-inverted output of the buffer 1 and provides a logical product to the set input terminal S of an SR flip-flop 6. An AND gate 5 receives the output of the delay circuit 3 and the inverted output of the buffer 1 and provides a logical product to the reset input terminal R of the SR flip-flop 6. Therefore, the timing of the rising edge of the SR flip-flop 6 is determined by the input signal to the S input terminal of the SR flip-flop 6, and timing of the falling edge is determined by the input signal to the R input terminal.

FIG. 2 shows a timing chart of the circuit illustrated in the block diagram in FIG. 1. The AND gate 4 generates a rising edge in response to the delayed rising edge from the delay circuit 2 at time td1 after the rising edge t1 of an input pulse, which decides the rising edge of the output of the RS flip-flop 6. Similarly, the AND gate 5 generates a rising edge in response to the delayed rising edge from the delay circuit 3 at time td2 after the falling edge t2 of the input pulse, which decides the falling edge of the output of the RS flip-flop 6.

The Japanese patent publication No. 7-95022 also discloses a specific example of an analog delay circuit usable for the delay circuits 2 and 3, which compares a variable reference voltage with a ramp waveform for changing the delay time. It is desirable that the delay time is accurate according to a user setting and adaptable to wide bandwidths of the input pulse. However, it is difficult for this analog method to produce a linear ramp waveform for high frequencies so it is difficult to get an accurate delay time for the high frequencies. In addition, random jitter in the comparator makes it difficult to produce small amounts of accurate delay time.

The Japanese patent publication No. 7-95022 further discloses a digital delay circuit that changes the delay time by selectively connecting a plurality of delay elements. The digital delay elements have a fixed delay time, which provides an accurate delay time for wide frequencies of an input pulse train. Further, higher resolution and wider delay time selection may be achieved by providing a large number of delay elements having shorter delay. FIG. 3 shows an equivalent block diagram of the digital delay circuit that has four delay lines DLs and four connection lines SLs, which are selectively cascaded by switches SWs to control the total delay time. The delay lines DLs have their own fixed delay time respectively and the connection lines SLs have no delay time.

U.S. Pat. No. 6,127,871 (corresponding to EP-A-853385) also discloses a digital delay circuit. Variable delay cells are cascaded to get a wide variable range of the delay time. U.S. patent application publication No. 2003/0041294 A1 discloses jitter generation using a digital delay unit.

One could use an output signal from an IC package as the reference pulse train. However, this would require many ICs to generate the many kinds of pulse trains. An arbitrary pulse train generator has been developed, which stores the data of the pulse trains to generate the real signals. Japanese patent publication No. 7-97130 (examined) discloses an example of the arbitrary pulse train generator.

A digital delay circuit as shown in FIG. 3 can provide an accurate delay time, but develops problems if the delay time is changed dynamically. That is, if a delay time is shorter than the following one, the former input pulse remains in one of the delay lines DLs and the later pulse reaches the output terminal of the last delay line faster so that the order of the input pulses may change or some pulses may mix at the output terminal. Thus, this type of digital delay circuit has shortcomings for jitter generation.

Referring to FIGS. 1 and 2, if the delay time td1 of the first delay circuit 2 is shorter than the pulse width Pw1 from the point t1 to t2, the output of the AND gate 4 has a rising edge. But if the delay time td1 of the first delay circuit 2 is longer than the pulse width Pw1, such as td3 of FIG. 2i, the output of the AND gate 4 has no rising edge because the logical product between the outputs of the first delay circuit 2 and the buffer 2 is low. That is, even if the delay time td3 is set to the first delay circuit 2, it does not produce a rising edge at the output of the SR flip-flop. This is similar to a falling edge case.

Accordingly, what is desired is to induce jitter to the rising and/or falling edges of pulses in a reference pulse train according to a user request. To induce the desired jitter to the edges, the delay time applied to the reference pulse train is varied continuously and controlled accurately. In addition, the present invention can provide a pulse train in which some of the pulses have jitter and others do not have jitter.

SUMMARY OF THE INVENTION

The jitter inducing circuit according to the present invention has a plurality of delay blocks that can delay the rising edge and/or the falling edge of each pulse in a reference pulse train by a preset delay time. A signal composer composes the outputs of the delay blocks. A delay setup means sets up the delay times for the rising edge and/or the falling edge of the pulses and provides the delay times to the delay blocks. A switch means selectively provides the pulses to one of the delay blocks. A switch control means controls the switch means to provide the pulses to a particular delay block subsequent to the delay setup means loading the delay times into the delay block.

The jitter inducing circuit may further have an input delay means to provide a delayed reference pulse train to the switch means. This allows the switch control means to use the input pulse as a trigger for controlling the supply of the pulses to the delay blocks. Because the delay time setting of the delay block does not change while the pulses pass through it, the order of the passing pulses do not change. Therefore, the delay block can adopt digital delay circuits that change the delay time by selectively connecting a plurality of delay elements. The digital delay circuit can provide an accurate delay time as a user desires, and then the change of the delays over time can be controlled to trace a desired function such as a sinusoidal or triangular function.

The delay block may have a buffer that provides non-inverted and inverted outputs. A first delay circuit delays the non-inverted output according to a preset delay time. A first one-shot pulse circuit converts the output of the first delay circuit into a one-shot pulse. A second delay circuit delays the inverted output according to a preset delay time. A second one-shot pulse circuit converts the output of the second delay circuit into a one-shot pulse. A logic circuit generates a first logic state in response to the output of the first one-shot pulse circuit, and generates a second logic state in response to the output of the second one-shot pulse circuit. This configuration enables the desired delay time to be set regardless of the pulse width in the reference pulse train.

The present invention also provides a method of pulse generation with jitter. A delay time(s) is set for the rising edge and/or falling edge of each pulse of serial intervals the reference pulse train. The reference pulse train is output interval by interval in the order of the sequential intervals and the pulses have jitter induced on the rising and/or falling edges for every interval. Further, the change of the delay time for sequential intervals may be controlled to be a desired function. The lengths of the intervals may be the same or changed interval by interval.

The present invention further provides a method for inducing jitter to a reference signal, or pulse train. Delay times are set for the rising edge and/or the falling edge of each pulse in the reference pulse train for a first delay block selected from a plurality of delay blocks. The first delay block delays the reference pulse train and couples an output to an output terminal. Delay times are set for the rising edge and/or the falling edge of each pulse in the reference pulse train for a second delay block selected from the plurality of the delay blocks other than the first delay block. The reference pulse train is switched from the first delay block to the second delay block. The second delay block delays the reference pulse train and couples an output to the output terminal.

The present invention can induce jitter on some designated pulses of the reference pulse train and not others. The designated pulses to be jittered are selected according to the user operation. A plurality of delay blocks delay the rising edges and/or the falling edges of the provided pulses by preset delay times and output them. A pulse providing means produces two kinds of pulse trains wherein one is to be jittered and the other is not to be jittered which are derived from the reference pulse train. The selected pulse trains are provided to the separate delay blocks. A delay setup means set the delay times of the rising edge and/or the falling edge to each of the delay blocks. The delay blocks to which the non-jittered pulses are provided have fixed delay times. The delay blocks to which the pulses to be jittered are provided change the delay time or times for each sequence of pulse trains. A signal composer composes the pulse trains from the delay blocks into an output signal.

The objects, advantages and other novel features of the present invention are apparent from the following detailed description when read in conjunction with the appended claims and attached drawings.

DETAILED DESCRIPTION OF THE INVENTION

A jitter inducing circuit according to the present invention can provide fast, accurate and continuous delay times to edges of an input reference pulse train. The input pulse train may be a normal pulse train used in various digital circuits, and is called a reference pulse train hereinafter. The output pulse train of the jitter inducing circuit may serve as a jitter tolerance test signal that is used for determining how much jitter causes operational errors in a digital circuit under test.

Figure 4:
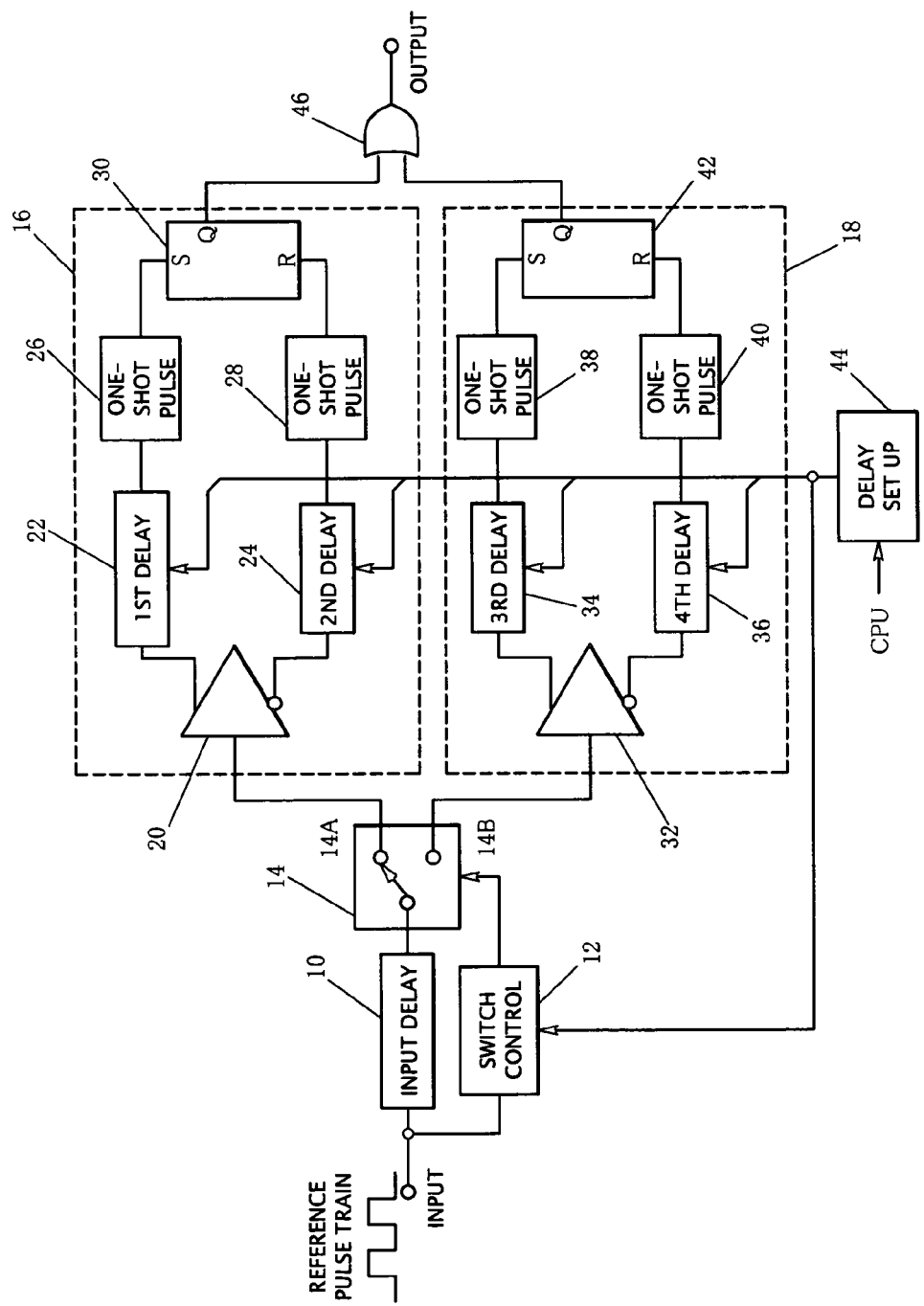
FIG. 4 is a block diagram of a preferred embodiment of the present invention.

FIG. 4 shows a schematic block diagram of a first embodiment of the jitter inducing circuit according to the present invention. The jitter inducing circuit operates under microprocessor control having well-known peripherals for a microprocessor system such as display, keyboard, mouse, CPU, RAM and hard disk drive though they are not shown. The hard disk drive stores computer program for conducting the procedures of the present invention.

An input delay circuit 10 and a switch control circuit 12 receive a reference pulse train to which jitter is to be induced. The switch control circuit 12 has switchable and non-switchable states. When it receives an input pulse during the switchable state, it changes the connecting terminal of a switch 14 from 14A to 14B or from 14B to 14A at the rising edge of the input pulse. In the non-switchable state, the rising edge of the input pulse does not change the connecting terminal of the switch 14.

A first delay block 16 delays rising and/or falling edges in the reference pulse train using independently preset delay times. A first buffer 20 receives the reference pulse train from the switch 14 to provide a non-inverted output to a first delay circuit 22, and an inverted output to a second delay circuit 24. First and second one-shot pulse circuit 26 and 28 convert the outputs of the first and second delay circuit 22 and 24 into one-shot pulses, respectively. A SR flip-flop 30 generates a logical high output H due to the output of the first one-shot pulse circuit 26, and generates a logical low output L due to the output of the second one-shot pulse circuit 28. In other words, the output of the first one-shot pulse circuit 26 decides the rising edge, and the output of the second one-shot pulse circuit 28 decides the falling edge.

Figure 1:
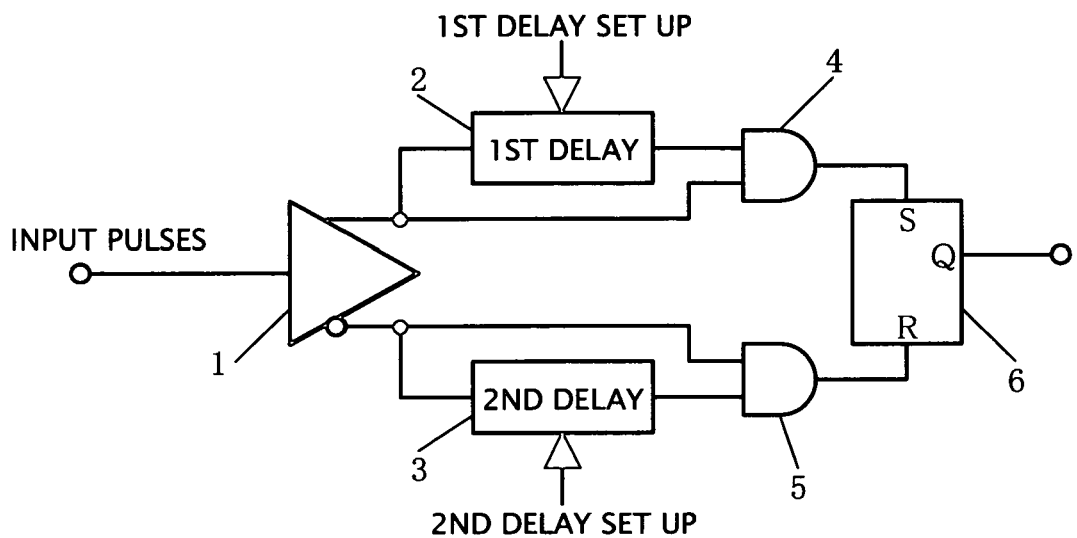
FIG. 1 is a block diagram of a conventional delay circuit independently controlling the delay times of the rising and falling edges of the input pulse.
Figure 2:
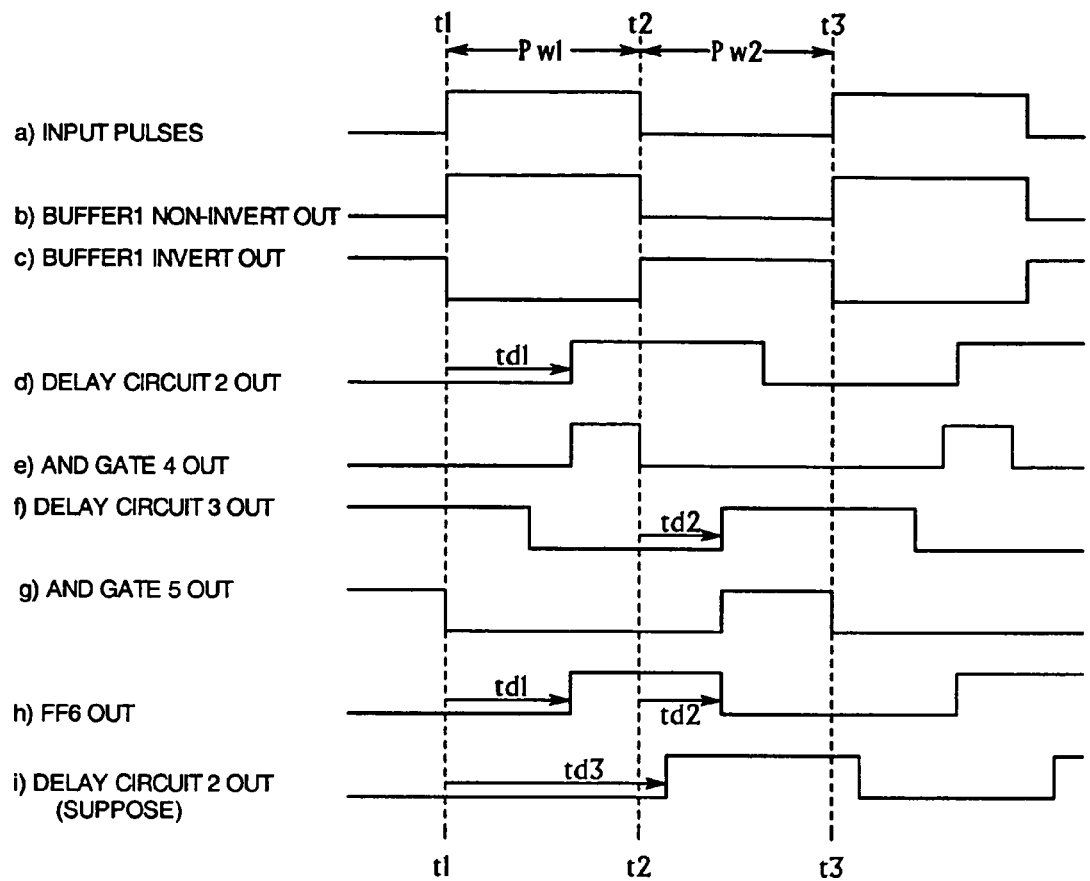
FIG. 2 is a timing chart according to a conventional delay circuit shown in FIG. 1.
Figure 3:
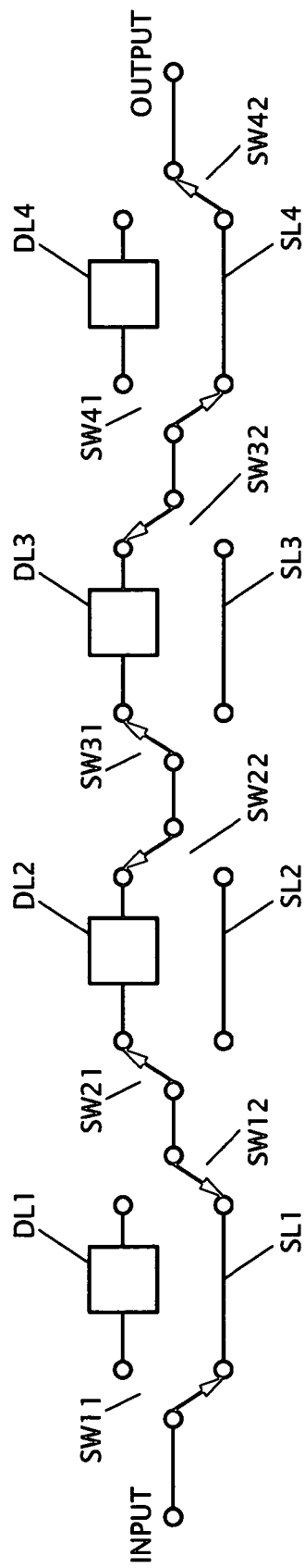
FIG. 3 is an equivalent circuit of a digital delay circuit.
Figure 5:
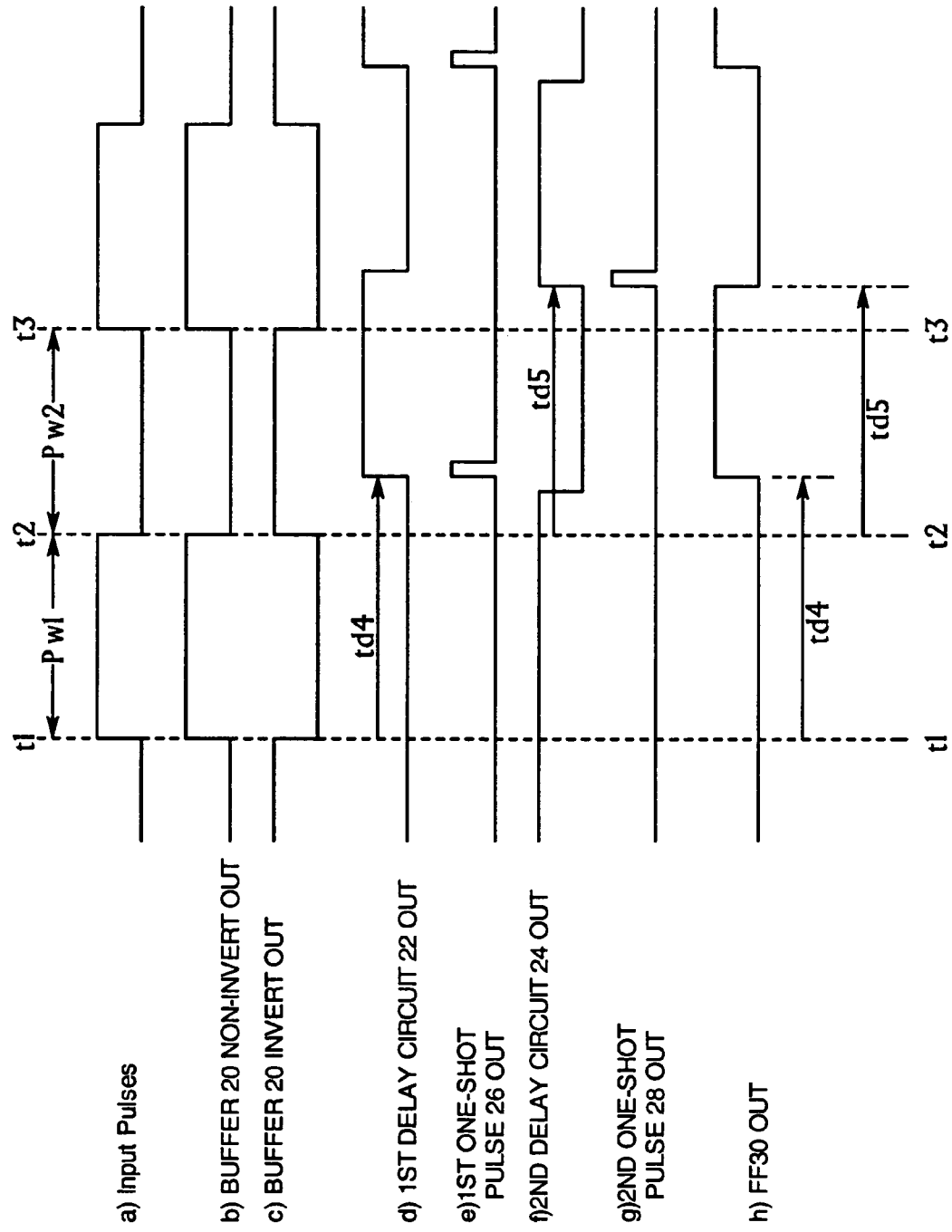
FIG. 5 is a timing chart of the circuit shown in FIG. 4.

FIG. 5 shows a timing chart explaining operations of the elements constituting the first delay block 16. The first delay circuit 22 delays the non-inverted output of the buffer 20 by a preset delay time td4 as shown in FIG. 5d. The second delay circuit 24 delays the inverted output of the buffer 20 by a preset delay time td5 as shown in FIG. 5f. Therefore, the first one-shot pulse circuit 26 outputs a one-shot pulse on the rising edge of the delayed input pulse at a delay time td4 after the rising edge t1 of the input pulse as shown in FIG. 5e, and the second one-shot pulse circuit 28 outputs a one-shot pulse on the rising edge of the delayed inverted input pulse at a delay time t5 after the falling edge of the input pulse t2 as shown in FIG. 5g. As a result, the SR flip-flop 30 outputs a pulse that rises in response to the delay time td4 after the rising edge t1 of the input pulse and falls in response to the delay time td5 after the falling edge of the input pulse t2. This means that the one-shot pulse circuits are able to set the rising and falling edges of the input pulse regardless of a pulse width of the input pulse. However, if the delay is always shorter than the pulse width, a circuit without the one-shot pulse circuits can be used as shown in FIG. 1. A delay setup circuit 44 presets the delay times td4 and td5 to the first and second circuits 22 and 24 respectively.

A second delay block 18 has the same configuration and operation as the first delay block 16 and need not be described in detail. The pair of the first and second delay blocks 16 and 18 makes it possible to change the delay time of one delay block while the pulses pass through the other delay block. The delay times do not change while the pulses pass through the active delay block so that the pulses of the reference pulse train do not change their order even if the delay circuit has a plurality of delay elements such as a digital delay circuit. The two delay blocks alternately receive delay time settings from the delay set up circuit 44, which provides for continuous and fast delay time changes in the jitter inducing circuit 10 and effectively induces jitter on the input pulse train.

The switching operation between the delay blocks of the jitter inducing circuit is described below. A user presets desired delay times and the switching times through the user interface (not shown) such as a keyboard. The switching operation is first described for switching the reference pulse train from the first delay block 16 to the second delay block 18. The delay setup circuit 44 has previously written delay time data to the first and second delay circuits 22 and 24 of the delay block 16 and the reference pulse train is coupled through connecting terminal 14A of switch 14 to the first delay block 16. The delay setup circuit 44 sets delay time data for the rising and falling edges into the respective third and fourth delay circuits 34 and 36 of the second delay block 18 under the control of a CPU (not shown). When the delay time data is written into the third and fourth delay circuits 34 and 36, the delay setup circuit 44 informs the switch control circuit 12 that the delay time data is loaded into the delay circuits 34 and 36. The switch control circuit 12 changes from the non-switchable state to the switchable state. If the switch control 12 receives an input pulse after the switchable state is enabled, it controls the switch 14 to change the terminal from 14A to 14B at the first rising edge of the input pulse in order to provide the input pulses to the second delay block 18. The switch control circuit 12 disables the switchable state after it changes the connecting terminal of the switch 14 from 14A to 14B.

Note that the input delay circuit 10 delays the input pulse that works as a trigger to change the connecting terminal of the switch 14 from 14A to 14B so that the input pulse reaches the switch 14 after the connecting terminal is switched from 14A to 14B. In other word, the delay of the input delay circuit 10 is a function of the time required to switch between the connecting terminals 14A and 14B of switch 14. Once the reference pulse train is switched to delay block 18, remaining pulses from the reference pulse train are processed by the delay block 16 and passed to the signal composition circuit prior to the delay setup circuit 44 loading the next delay time data into the first and second delay circuits 22 and 24.

When the delay setup circuit 44 finishes writing the delay time data into the first and second delay circuit 22 and 24, it informs the switch control circuit 12 that the delay time data writing is completed. The switch control circuit 12 then enables the switchable state. If the switch control circuit 12 receives the input pulse after the switchable state is enabled, it controls the switch 14 to change the terminal from 14B to 14A at the first rising edge of the input pulse in order to provide the input pulses to the first delay block 16. The switch control circuit 12 returns to the non-switchable state after it changes the connecting terminal of the switch 14 from 14B to 14A. The delay blocks 34 and 36 of delay circuit 18 are then loaded with the delay time values and the above operation is repeated.

The above operation can vary the delay time of each edge of the output pulse, that is, each edge can have jitter. It is also possible to set constant delay times which then provides non-jittered pulses. Thus, the jitter inducing circuit according to the present invention can provide various jittered pulses upon the user setting.

The number of pulses passing the first and second delay blocks may be one or more according to the lengths of the switching interval or cycle of the switch 14. The CPU controls the switching interval of the switch 14 as well as the timing of writing the delay time data into the delay circuits. These controls are based on the user setting.

In the described example, the switch control circuit 12 changes from the non-switchable state to the switchable state in response to delay time data loaded command from the delay setup circuit 44. However, the CPU may directly control the transition of the switch control circuit 12 from non-switchable state to the switchable state. The state transition timing of the switch control circuit 12 from non-switchable state to the switchable state should be after the delay time data is written into the next delay circuit through which the upcoming pulses will pass, but it is not necessary to be just after the delay data is written, and some waiting time may be provided before the transition to the switchable state occurs.

Figure 6:
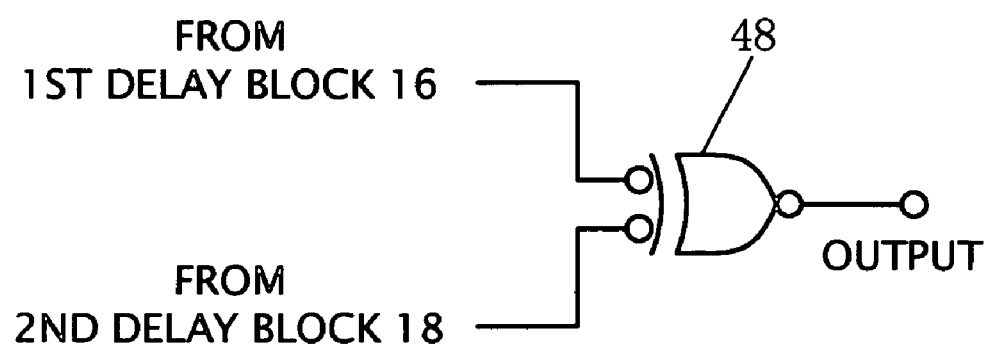
FIG. 6 is another example of a signal composer.

The signal composer 46 composes the outputs of the first and second delay block 16 and 18, and the composed output is provided to an output terminal 48. The signal composer 46 may be implemented as a logic product circuit, such an OR gate as shown in FIG. 4, or other such logic circuits, such as the Exclusive OR gate shown in FIG. 6. Further, any logic circuit that provides high and low outputs according to two inputs maybe used as the composer.

The above described jitter inducing circuit uses two delay blocks, but three or more delay blocks may be used. In this case, the switch 14 selectively switches the reference input pulses to the delay block that has finished loading the delay time data from the delay block that is currently passing the pulses. This approach allows the time for writing the delay time data to be longer and the time using one delay block, or one interval to be shorter than the case of the two delay blocks. Since the time to write the delay time data is longer, the delay time data can be rewritten more frequently.

Figure 7:
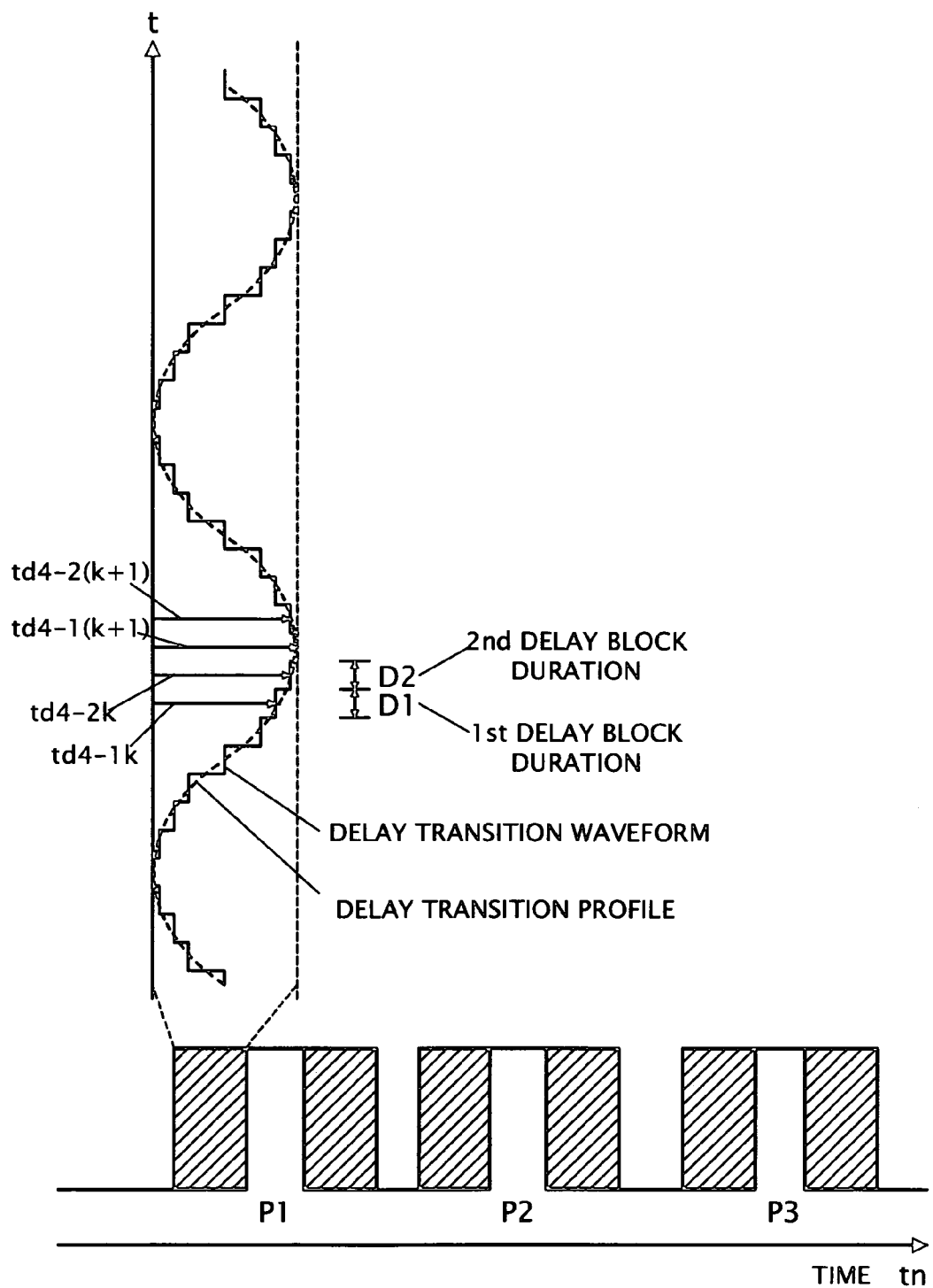
FIG. 7 is a schematic diagram showing relationship between a jittered edge and the change of the delay time.

FIG. 7 shows the relationship between a jittered edge and the variation of the delay time. The horizontal axis is time tn showing that the same input pulse train (representatively shown as P1, P2 and P3) is provided n times and delayed by different delay times. Shaded areas of the pulse edges represent jitter in the pulse train. The vertical axis is a time axis t and the graph shows changes the delay time of the rising edge of a pulse P1 over time.

The reference pulse train provided to the jitter inducing circuit passes the first and second delay blocks 16 and 18 alternately, and the respective delay times of the rising edge during the intervals D1k and D2k are set to td4-1k and td4-2k respectively. The suffix k is an integer. A user can set the intervals D1k and D2k of the first and second delay block 16 and 18 to preferred lengths as long as they do not fall below the writing time of the delay time data in the other block. The user can also set the delay times td4-1k and td4-2k of the respective delay blocks to preferred lengths. The number of pulses during the interval D1 or D2 may be one or more.

In FIG. 7, the delay td4 changes step by step every interval, but the profile coarsely traces sine waveform. It is not by chance but set to change like this intentionally. Hereinafter, the waveform showing the delay time change is called a delay time transition waveform, and the curve showing rough changes of the delay time transition waveform is called a delay profile.

Figure 8:
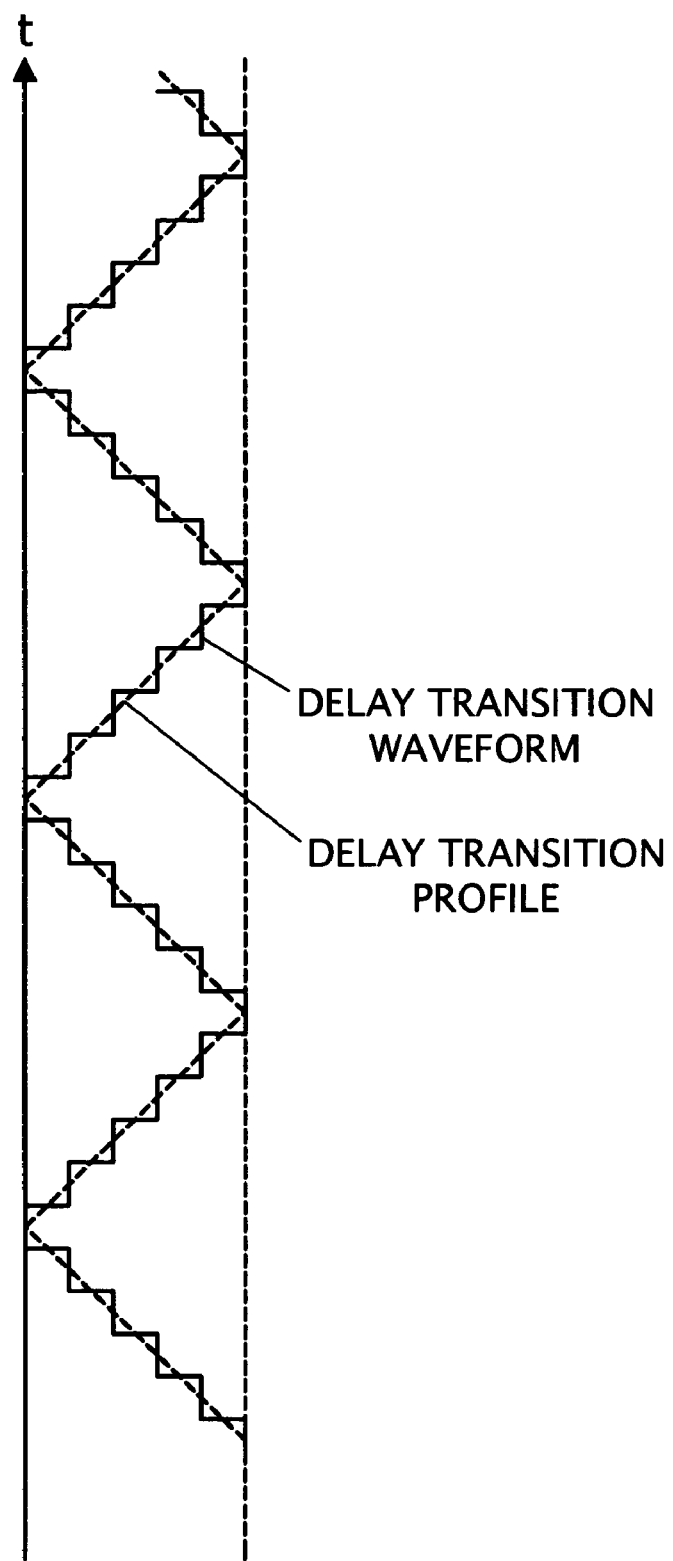
FIG. 8 is an example of a profile of a delay time transition that is a triangular function.
Figure 9:
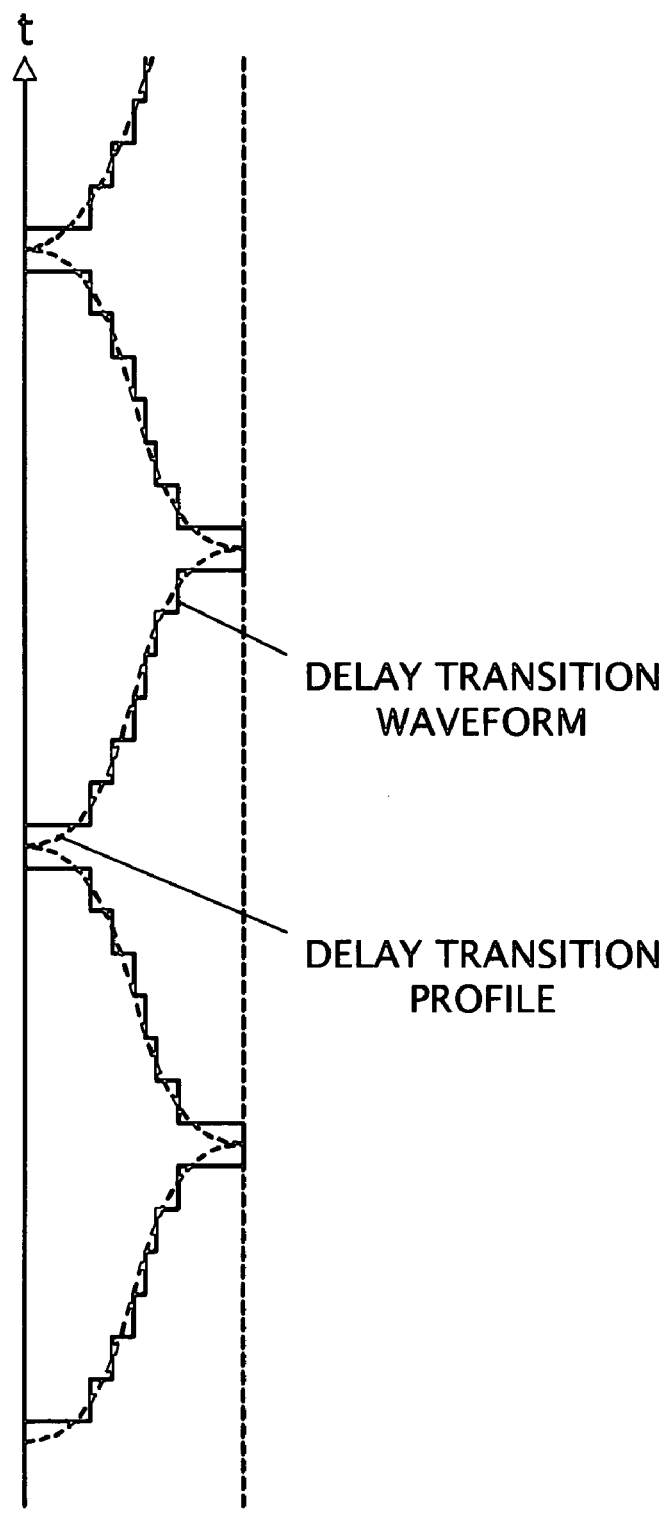
FIG. 9 is other example of a profile of a delay time transition function.

The delay profile is not only a sinusoidal function but also any curves that the user requests. FIG. 8 shows an example of the delay profile being a triangular waveform and FIG. 9 shows another waveform function for the delay profile. A microprocessor system can control delay profile shape by controlling switching time between the first and second delay blocks. The microprocessor system also controls the delay of each delay block using well know art. FIGS. 7–9 show that the intervals of the first and second delay blocks 16 and 18 are the same, but the lengths of the intervals may be changed every time, which produces more complicated jitter.

Figure 10:
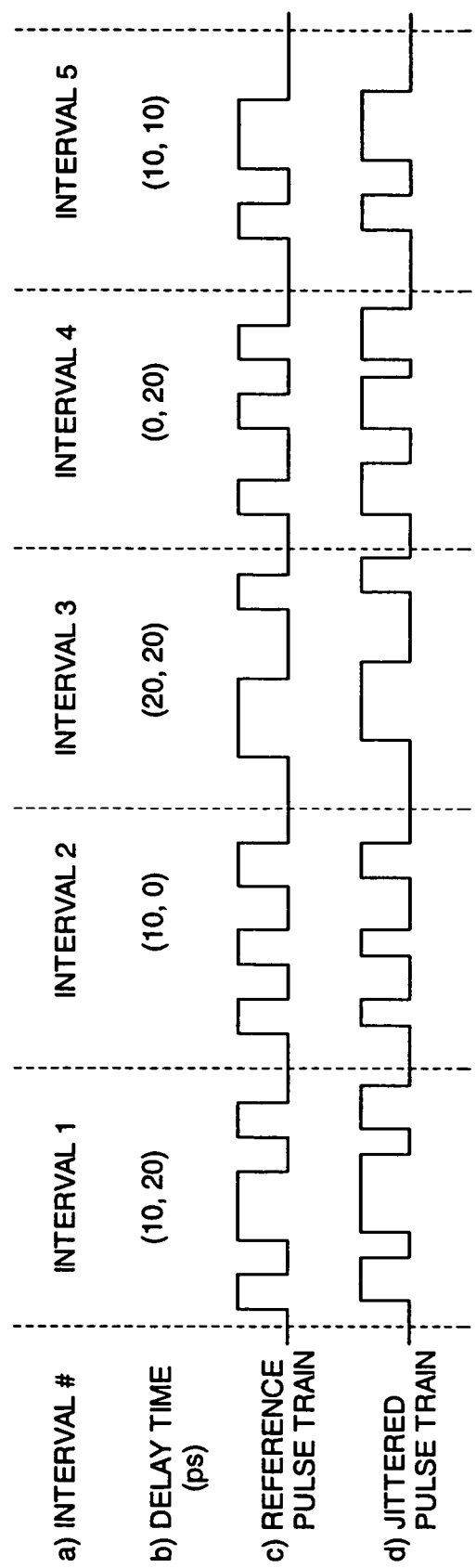
FIG. 10 is a timing chart for comparing a reference pulse train and a jittered pulse train on time axis.

FIG. 10 shows relationship on the time axis between a jittered pulse train and a reference pulse train. The delay in the rising edges and falling edges of the reference pulse train are grouped by intervals defined by the switching interval of the switch 14. FIG. 10a shows sequential interval numbers. FIG. 10b shows delays of the rising and falling edges of each interval by indicating two numbers separated by commas. For example, the delays of the rising and falling edges for interval 1 are 10 ps (picosecond) and 20 ps respectively. FIG. 10c shows the reference pulse train, and FIG. 10d shows delayed pulse train in which the edges are delayed according to the delay times shown in FIG. 10b. In case of FIG. 4, the first delay block 16 delays the edges of the odd number intervals, and the second delay block does the edges of the even number intervals.

As described above, the rising and falling edge delay times may be changed every interval according to a desired function. In this case, the delay time variation or the delay profile may be set by using parameters of the function instead of setting delay times of each interval. That is, the user may designate the function, frequency, amplitude etc. for the delay profile, and a microprocessor (not shown) calculates the delay times of each edge for each interval instead of the user directly setting the delay times of each interval.

According to the present invention, the pulse order does not change during each interval. However, pulses around a border between adjacent intervals may change the sequential order. This may happen if the delay of the rising edge in the preceding interval is longer than that in the following interval. To prevent this problem, the present invention controls the delay of the rising edge in the preceding interval so as not to be too short relative to that in the following interval. For example, if the delay profile is controlled to trace a continuous function such as sine waveform, the sequential order of the pulses is maintained.

Figure 11:
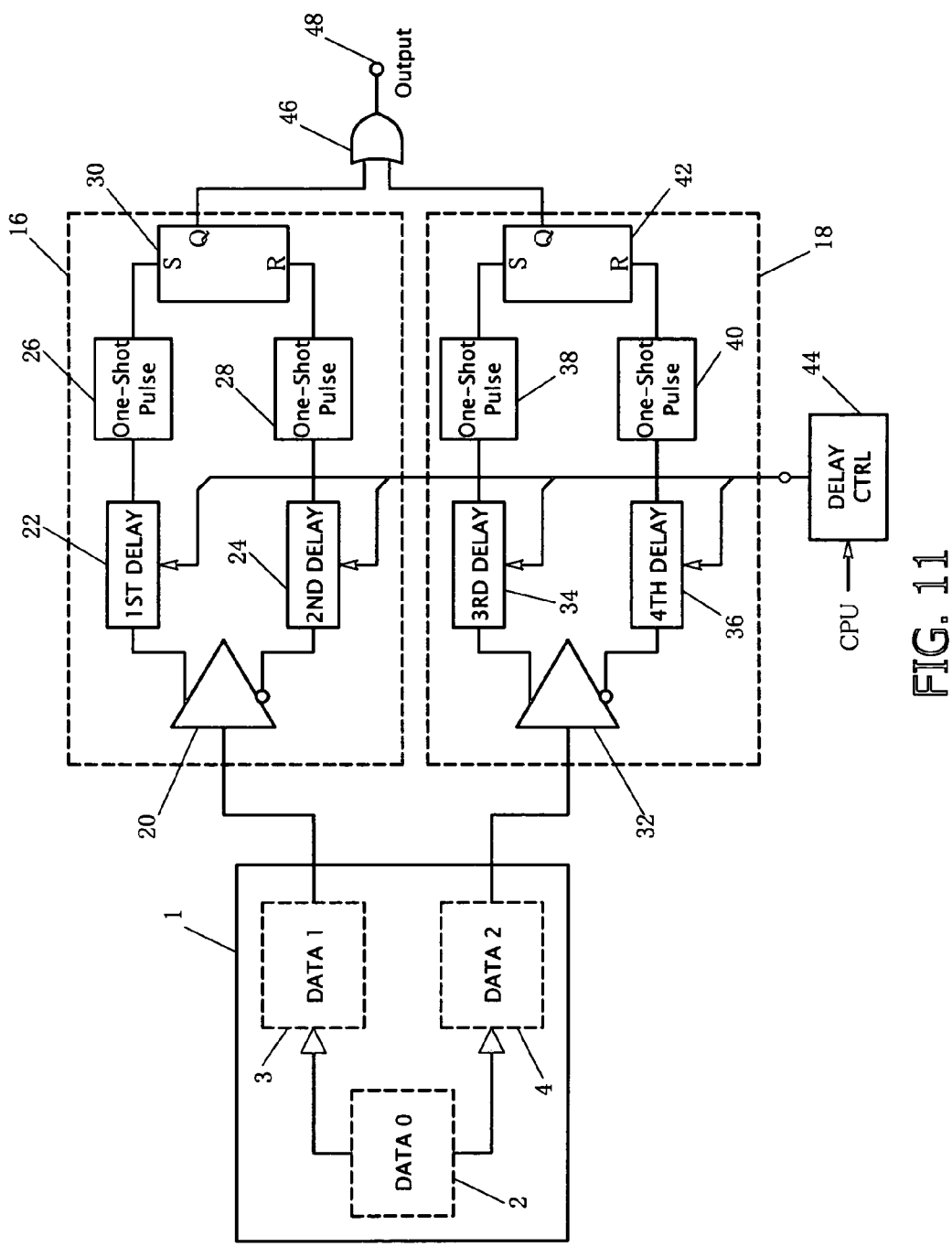
FIG. 11 is a block diagram of another embodiment according to the present invention.

FIG. 11 is a block diagram of another preferred embodiment of the present invention. This embodiment can provide a partially jittered pulse train. A pulse provider 50 has a memory 51 for storing data related to pulse trains, a clock oscillator (not shown) for generating a reference signal for circuit operation, and drive circuits 52 and 53 for providing real pulse trains derived from the data. Japanese patent publication No. 7-97130 (examined) discloses such a pulse provider, or generator.

The pulse provider 50 stores data 0 corresponding to a reference pulse train in the memory 51. If a user want to generate a partially jittered pulse train where some but not all of the pulses have jitter in the reference pulse train, the user selects a partial jitter mode and designates pulses to which jitter is to be induced from a plurality of pulses in the reference pulse train. The user may select the pulses to be jittered individually, or designates a duration for which jitter is induced in the reference pulse train.

Figure 12:
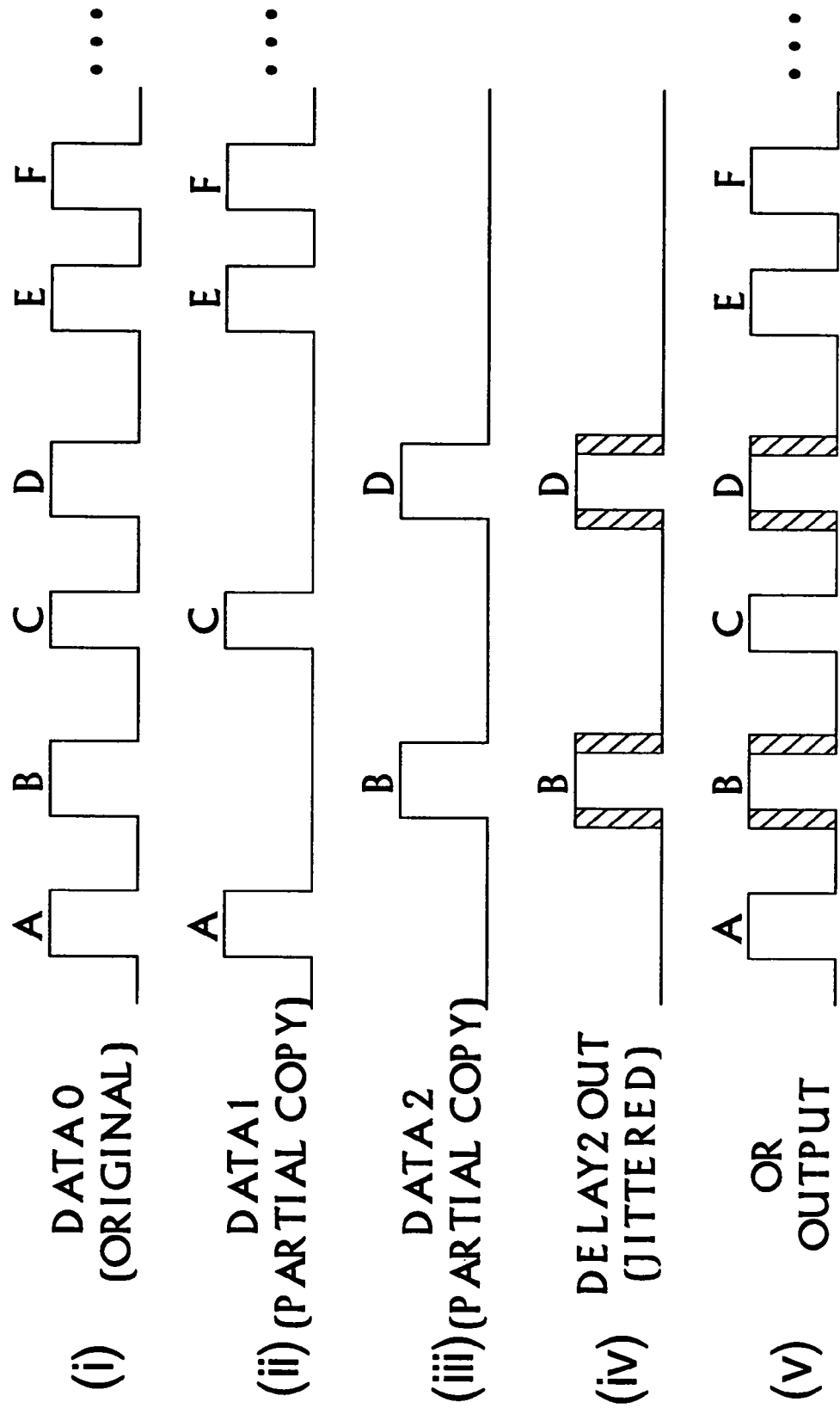
FIG. 12 is a timing chart explaining operation of the block diagram shown in FIG. 11.

Referring to FIG. 12(*i*)–(*iii*), when the pulses to be jittered have been designated, the pulse provider 50 respectively produces data 1 and data 2 corresponding to the selected non-jittered and jittered pulses of the reference pulse train by copying the non-jittered portion of the data 0 reference pulse train into data 1 and the jittered portion of the data 0 reference pulse train into data 2. The first and second drive circuits 52 and 53 convert the data 1 and the data 2 into the real pulse signals that are repeatedly provided to the first and second delay blocks 16 and 18 in a cycle which is decided by the length of the reference pulse train.

If the user selects the partial jitter mode, the delay times of the first delay block 16 are fixed for the intervals. On the other hand, the delay time data of the third and forth delay circuits 34 and 36 of the second delay block 18 are rewritten sequentially. In comparison, the circuit shown in FIG. 1 (whole jittered mode) does not have the switching operation between the first and second delays 2 and 3 so that it cannot rewrite the delay time data of the second delay 3 while the pulse train passes through the first delay 2. In the present invention, only some of the pulses of the reference pulse train pass through the second delay block 18 and the pulse data that the pulse provider 50 provides is previously known so that the delay time data of the third and fourth delay circuits 34 and 36 can be rewritten while the non-jittered pulses pass through the delay circuits 22 and 24.

The delay time data of the second delay block 18 may be rewritten in a cycle that is decided by the length of the reference pulse train. In this case, the positions of the rising and/or falling edges shown in FIG. 12(*iii*) change every cycle that the rising and/or the falling edges have jitter for a plurality of the cycles (see FIG. 12(*iv*)). However, if the adjacent pulses to which the jitter are induced, such as pulses B and D in FIG. 12(*iii*), have enough time distance from each other, the delay data values may be changed for every jittered pulse. The delay times of the third and fourth delay circuits 34 and 46 may be changed according to desired functions as described above.

The signal composer 46 composes the outputs of the first and second delay blocks 16 and 18 to provide a pulse train in which only the user designated pulses have jitters (see FIG. 12(v)). In FIG. 11, the signal composer 46 is realized by an OR circuit, but other logical circuit may be used.

Figure 13:
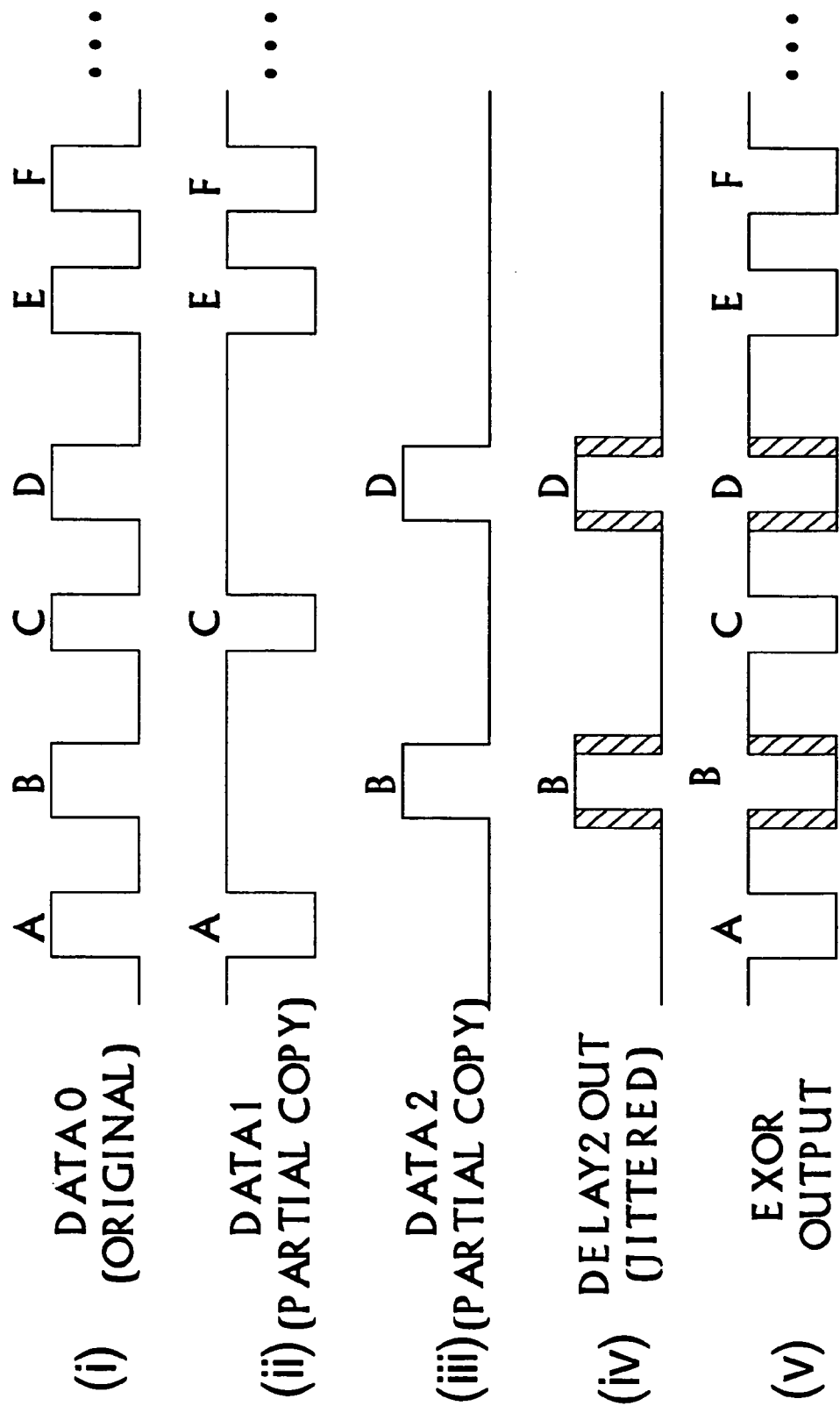
FIG. 13 is a timing chart explaining another operation of the block diagram shown in FIG. 11.

In FIG. 13, the data 0 for the reference pulse train is based on the negative logic and an exclusive OR logic circuit (not shown) is used as the signal composer 46. The data 1 for non-jittered pulses are produced based on the negative logic (see FIG. 13(ii)). On the other hand, the data 2 for jittered pulses are produced by inverting the data 0 (see FIG. 13(iii)). The data 1 and the jittered data 2 are composed to provide a pulse train that has jitter at the edges of the user-designated pulses. Note that the order of the jittered edges is the falling and rising edges (see FIG. 13(v)).

In FIG. 11, the preferred embodiment of the present invention uses the two delay blocks, but three or more delay blocks may be used. In this case, one delay block can receive the non-jittered pulses and other blocks receive jittered pulses. If the two or more delay blocks provide jittered pulse trains having different delay values, it can provide a more complicated jittered pulse train. For example, if adjacent pulses in the same delay block were close to each other, it would be difficult to rewrite the delay time data of the delay block pulse by pulse. But if the pulses are provided to different delay blocks respectively, the adjacent pulses can have different jitter amounts at the composed output terminal.

As described above, the jitter inducing circuit according to the present invention does not change the order of pulses in a pulse train as they are input. This makes it possible to use a digital delay circuit that can apply accurate delays to the rising and falling edges of the reference pulse train according to the user request. This means the rising and falling edges can have deterministic jitters as the user desires, and the delay time variation, or profile over the sequential interval can be controlled to trace desired functions. The present invention is preferable to use with a digital data based pulse provider or generator.

What is claimed is:

1. A jitter inducing circuit comprising:
   a plurality of delay means for delaying rising and/or falling edges of pulses of a reference pulse train,
   a signal composer for composing the outputs of a plurality of said delay means,
   a delay time setup means for setting the delay times of said rising and/or falling edges to a plurality of said delay means,
   a switch means for selectively providing the pulses of said reference pulse train to one of a plurality of said delay means, and
   a switch control means for controlling said switch means to provide said pulses to one delay means in which the setup of said delay time has finished.

2. A jitter inducing circuit recited in claim 1 further comprising:
   an input delay means for delaying said reference pulse train so that said switch control means receives said reference pulse train before said switch means to control said switch means according to the input of the reference pulse train.

3. A jitter inducing circuit recited in claim 1 wherein said delay time setup means changes said delay time as a function of a delay time transition waveform.

4. A jitter inducing circuit recited in claim 1 wherein said delay means has a buffer circuit for providing non-inverted and inverted outputs, a first delay circuit for delaying said non-inverted output by a preset delay time, a first one-shot pulse circuit for converting the output of said first delay circuit into one-shot pulse, a second delay circuit for delaying said inverted output by a preset delay time, a second one-shot pulse circuit for converting the output of said second delay circuit into one-shot pulse, and a logic circuit for providing a logic signal according to the outputs of said first and second one-shot pulse circuits.

5. A jitter inducing method comprising the steps of:
   setting delay times of rising and/or falling edges of pulses in a reference pulse train in a first delay block selected from a plurality of delay blocks,
   delaying said reference pulse train by said first delay block and providing an output to an output terminal,
   setting delay times of the rising and/or falling edges of pulses in a reference pulse train to a second delay block selected from a plurality of delay blocks other than said first delay block,
   switching the supply of the reference pulse train to said second delay block from said first delay block, and
   delaying said reference pulse train by said second delay block and providing an output to said output terminal.

6. A jitter inducing method recited in claim 5 wherein said delay times to the plurality of said delay blocks are controlled as a function of time so that the change of said delay time traces a desired function.

7. A circuit for generating a pulse train comprising:
   a plurality of delay blocks for delaying rising or falling edge of a provided pulse according to a preset delay time,
   a pulse providing means for providing a pulse to be jittered and a pulse not to be jittered to separate delay blocks of the plurality of said delay blocks wherein both said pulses are derived from a reference pulse train,
   a signal composing means for composing the outputs of the plurality of said delay blocks, and
   delay time setup means for setting said delay times for the rising or falling edges of said pulses to the plurality of said delay blocks,
   wherein said delay times for said delay block to which said non-jittered pulse is provided is fixed, and said delay time of said delay block to which said pulse to be jittered is provided changes sequentially.

8. A pulse generating method comprising the steps of:
   a) generating a pulse to be jittered and a pulse not to be jittered based on a reference pulse train,
   b) delaying the rising edge or the falling edge of said pulse to be jittered according to a preset delay time,
   c) composing said non-jittered pulse and said pulse delayed in step (b), and
   d) repeating steps (a) through (c) wherein said delay time in said step (b) changes every time.

* * * * *